US009425790B2

(12) United States Patent
Stone

(10) Patent No.: US 9,425,790 B2
(45) Date of Patent: Aug. 23, 2016

(54) CONDUCTIVE ELEMENT

(75) Inventor: Kate Stone, Cambridge (GB)

(73) Assignee: Novalia Ltd. (GB)

( * ) Notice: Subject to any disclaimer, the term of this patent is extended or adjusted under 35 U.S.C. 154(b) by 156 days.

(21) Appl. No.: 13/982,078

(22) PCT Filed: Jan. 27, 2012

(86) PCT No.: PCT/GB2012/050171
§ 371 (c)(1),
(2), (4) Date: Sep. 12, 2013

(87) PCT Pub. No.: WO2012/101448
PCT Pub. Date: Aug. 2, 2012

(65) Prior Publication Data
US 2014/0021027 A1 Jan. 23, 2014

(30) Foreign Application Priority Data
Jan. 28, 2011 (GB) .................................. 1101510.4

(51) Int. Cl.
*H03K 17/955* (2006.01)
*H03K 17/96* (2006.01)

(52) U.S. Cl.
CPC ............ *H03K 17/955* (2013.01); *H03K 17/962* (2013.01); *H03K 17/9622* (2013.01); *H03K 2017/9602* (2013.01); *H03K 2217/960755* (2013.01)

(58) Field of Classification Search
CPC ....... G01R 27/26; H03K 17/955; H03K 17/94
USPC ........................................... 200/600, 46, 5 R
See application file for complete search history.

(56) References Cited

U.S. PATENT DOCUMENTS

| 5,844,506 | A | 12/1998 | Binstead |
| 7,528,337 | B2 * | 5/2009 | Tanabe et al. ................. 200/511 |
| 2005/0030048 | A1 | 2/2005 | Bolender et al. |
| 2007/0018998 | A1 | 1/2007 | Hagglund et al. |
| 2008/0048997 | A1 * | 2/2008 | Gillespie et al. .............. 345/174 |
| 2008/0129193 | A1 | 6/2008 | Asabe et al. |
| 2009/0096759 | A1 | 4/2009 | Nishiwaki et al. |
| 2009/0218310 | A1 | 9/2009 | Zu et al. |
| 2009/0295285 | A1 | 12/2009 | Tokunaga et al. |

(Continued)

FOREIGN PATENT DOCUMENTS

| CN | 101410779 A | 4/2009 |
| DE | 10 2008 004423 A1 | 7/2009 |

(Continued)

OTHER PUBLICATIONS

Written Opinion of the International Search Authority (Form PCT/ISA/237), mailed Sep. 6, 2012 (8 pages).

(Continued)

*Primary Examiner* — Edwin A. Leon
*Assistant Examiner* — Iman Malakooti
(74) *Attorney, Agent, or Firm* — Ware, Fressola, Maguire & Barber LLP

(57) ABSTRACT

A conductive element which can serve as capacitive sensing element comprises a conductive pad comprising relatively low conductivity material, such as carbon-based ink, and a conductive mesh comprising relatively high conductivity material, such as silver-based ink, underlying or overlying the pad to form a composite conductive element.

32 Claims, 4 Drawing Sheets

(56) References Cited

U.S. PATENT DOCUMENTS

| | | | |
|---|---|---|---|
| 2010/0045632 A1 | 2/2010 | Yilmaz et al. | |
| 2010/0053114 A1 | 3/2010 | Kaigawa | |
| 2010/0181557 A1 | 7/2010 | Sun | |
| 2011/0012845 A1* | 1/2011 | Rothkopf et al. | 345/173 |
| 2011/0203654 A1 | 8/2011 | Kihara et al. | |
| 2012/0056664 A1 | 3/2012 | Nam | |

FOREIGN PATENT DOCUMENTS

| | | |
|---|---|---|
| EP | 2 068 328 A1 | 6/2009 |
| EP | 2 405 328 A2 | 1/2012 |
| JP | 9-153667 A2 | 6/1997 |
| JP | 2008-130449 A | 6/2008 |
| JP | 2010-286886 A | 12/2010 |
| KR | 10-0944519 B1 | 3/2010 |
| WO | 95/27334 A1 | 10/1995 |
| WO | 2004/077286 A1 | 9/2004 |
| WO | 2010/064709 A1 | 6/2010 |
| WO | 2010/101399 A2 | 9/2010 |

OTHER PUBLICATIONS

Espacenet, English Abstract, KR 10-0944519 (1 page).
Espacenet, English Abstract, DE 10 2008 004423 (1 page).
GB Search Report, Intellectual Property Office, Application No. GB1101510.4 (2 pages).
Espacenet, English Abstract, Japanese Publication No. JP 9-153667 A (1 page).
International Preliminary Report on Patentability, issued Jul. 30, 2013 (10 pages).
Bibliographic data including English abstract of CN101410779A, 2 pages.
Chinese office action dated Sep. 25, 2015 (application No. 201280015720.4) including a list of four references, only the first of which is not already of record (CN101410779A), 10 pages.
Machine translation CN101410779A, 59 pages.
English Abstract, JP 2008-130449 A, 1 page.
Machine Translation of Claims of JP 2008-130449 A, 2 pages.
Machine Translation of Detailed Description of JP 2008-130449 A, 13 pages.
English Abstract, JP 2010-286886 A, 1 page.
Machine Translation of Claims of JP 2010-286886 A, 2 pages.
Machine Translation of Detailed Description of JP 2010-286886 A, 7 pages.
Notice of Rejection from Japanese Patent Office, Japanese Patent Application No. 2013-550953, dated Mar. 15, 2016, 4 pages.

* cited by examiner

CONDUCTIVE ELEMENT

FIELD OF THE INVENTION

The present invention relates to a conductive element for an interactive printed article, such as a poster, book or greeting card.

BACKGROUND

Conductive elements, such as capacitive sensing elements and conductive tracks, are increasingly being incorporated into printed articles, such as books, posters and greeting cards, to allow printed articles to become interactive. Examples of interactive printed articles are described in GB 2 464 537 A, WO 2004 077286 A, WO 2007 035115 A and DE 1993 4312672 A.

Such interactive printed articles can suffer one or more drawbacks.

Capacitive sensing elements can be formed using conductive inks containing particles or flakes of carbon or a metal, such as silver. Metal-based inks tend to have better electrical properties than carbon-based inks. However, metal-based inks are generally more expensive and can be more damaging to the environment than carbon-based inks.

Conductive tracks, usually formed from conducting ink, are used to connect the capacitive sensing elements to terminals. If a wide track is used, then the track may have a sufficiently large capacitance to serve as a capacitive sensing element. Thus, proximity of a user's finger to the track may unintentionally trigger a response. One solution is to reduce the width of the track and, thus, its capacitance. However, this has the effect of increasing the resistance of the track thereby reducing the maximum frequency of operation. Normally, if the width of the track is reduced, then a shorter track is used. The use of a narrower track also increases the chances that a broken track is formed during manufacture due to a defect, for example, a print defect, or that a working track is broken when handled or processed.

SUMMARY

The present invention seeks to provide an improved conductive element for use as a capacitive sensing element.

According to a first aspect of the present invention there is provided a conductive element comprising a conductive pad comprising relatively low conductivity material and a conductive mesh comprising relatively high conductivity material, the mesh underlying or overlying the pad to form a composite conductive element Thus, the conductive element can be formed using less high conductivity material without significantly reducing conductivity of the conductive element. This means that the conductive element can be quickly charged and discharged.

The conductive element can be used as a single-key capacitive sensing element (or "capacitive touch or proximity switch" or "capacitive touch or proximity button"). The low conductivity material is preferably a conductive ink, such as carbon-based conductive ink, which can be printed onto a substrate. The relatively high conductivity material, which may be a metal-based conductive ink or foil, may underlie or overlie the pad and/or be in plane with the pad. The mesh and pad are in direct contact and form a composite conductive element.

The conductive element may be supported on an opaque substrate. Thus, the pad and/or the mesh may be opaque and so a wide choice of materials, geometries and layer thicknesses can be used.

The substrate may be flexible and may be paper, card and/or plastic.

According to a second aspect of the present invention there is provided a conductive element comprising a conductive pad comprising relatively low conductivity material and having a reversed out image of a conductive mesh having relative narrow line width and a conductive mesh comprising relatively high conductivity material, aligned with the reversed out image and having a relatively wide line width and arranged to form a composite conductive element.

Thus, the conductive element can be formed by printing the conductive pad using a relatively low conductivity ink, such as a carbon-based conductive ink, and then printing the conductive mesh using a relatively high conductivity ink, such as a metal-based conductive ink, while the conductive pad is still wet. Since at least a portion of the conductive mesh is printed in ink-free areas (i.e. the reversed out image), this can help to reduce intermixing of the inks, which might reduce the conductivity of the relatively high conductivity ink.

The conductive pad may have a sheet resistance of at least 1 k$\Omega$sq$^{-1}$, at least 2 k$\Omega$sq$^{-1}$ or at least 5 k$\Omega$sq$^{-1}$. The conductive pad may have a sheet resistance of at least 10 k$\Omega$sq$^{-1}$, at least 20 k$\Omega$sq$^{-1}$ or at least 50 k$\Omega$sq$^{-1}$. The conductive pad may have a sheet resistance no more than 20 k$\Omega$sq$^{-1}$ or no more than 50 k$\Omega$sq$^{-1}$.

The conductive mesh may have a sheet resistance (when tested as a solid pad) of no more than 50 $\Omega$sq$^{-1}$, no more than 20 $\Omega$sq$^{-1}$ or no more than 10 $\Omega$sq$^{-1}$. The conductive mesh may have a sheet resistance of no more than 5 $\Omega$sq$^{-1}$, no more than 2 $\Omega$sq$^{-1}$ or no more than 1 $\Omega$sq$^{-1}$. The conductive mesh may have a sheet resistance of at least 0.1 $\Omega$sq$^{-1}$, at least 0.2 $\Omega$sq$^{-1}$, at least 0.5 $\Omega$sq$^{-1}$ or at least 1 $\Omega$sq$^{-1}$.

The conductive pad may comprise conductive ink, such as a carbon-based conductive ink. The conductive pad may comprise a conductive polymer. The conductive mesh may comprise a conductive ink. The mesh may comprise a metal-based conductive ink, such as a silver-based conductive ink or a copper-based conductive ink. The conductive mesh may comprise a conductive foil. The conductive mesh may comprise a conductive polymer.

The pad and mesh preferably cover the same area or about the same area. For example, the conductive pad may have an area, $A_p$, and the conductive mesh may have an area, $A_m$, and $1.5 \times A_p \geq A_m \geq 0.67 \times A_p$, $1.2 \times A_p \geq A_m \geq 0.83 \times A_p$, $1.1 \times A_p \geq A_m \geq 0.91 \times A_p$ or $A_p \approx A_m$.

The conductive element may cover a surface area of at least 100 mm$^2$, at least 200 mm$^2$ or at least 500 mm$^2$. The conductive element may cover a surface area of at least 1,000 mm$^2$, at least 2,000 mm$^2$ or at least 5,000 mm$^2$. The conductive element may cover a surface area of no more than 5,000 mm$^2$, no more than 10,000 mm$^2$ or no more than 20,000 mm$^2$. The conductive pad may comprise a layer which is a solid block.

The conductive pad may have a thickness of at least 1 µm, at least 2 µm, at least 5 µm or at least 10 µm. The conductive pad may have a thickness no more than 5 µm or no more than 10 µm. The conductive pad may have a thickness in a range of about 1 µm to about 5 µm.

The conductive mesh may have a thickness of at least 1 µm, at least 2 µm, at least 5 µm or at least 10 µm. The conductive mesh may have a thickness of no more than 5 µm or no more than 10 µm. The conductive mesh may have a thickness in a range of about 1 µm to about 5 µm. The conductive mesh may comprise track(s) having a width of at least 100 µm, at least 200 µm or at least 500 µm.

The conductive mesh may comprise track(s) having a width no more than 1 mm, no more than 2 mm or no more than 5 mm. The conductive mesh may comprise track(s) having a width of at least 1 mm, at least 2 mm or at least 5 mm.

The conductive mesh may include open areas without the relatively high conductivity material, each open area being least 20 mm², at least 50 mm² or at least 100 mm².

The mesh may comprise an array of tracks. The tracks need not run parallel. The tracks need not be straight. The tracks may curve, be waved or sinusoidal.

The mesh may comprise a rectangular array of tracks. The rectangular array may comprise at least one row of tracks, at least two rows of tracks, at least three rows of tracks, at least four rows of tracks, at least five rows of tracks, at least six rows of tracks, at least seven rows of tracks, at least eight rows of tracks, at least nine rows of tracks or at least ten rows of tracks. The rectangular array may comprise at least one column of tracks, at least two columns of tracks, at least three columns of tracks, at least four columns of tracks, at least five columns of tracks, at least six columns of tracks, at least seven columns of tracks, at least eight columns of tracks, at least nine columns of tracks or at least ten columns of tracks. At least two rows of tracks may be equally spaced apart. At least two columns of tracks may be equally spaced apart. The rectangular array of tracks may be a square array.

The mesh may comprise a circular array of tracks. The circular array may be elliptical. The circular array may comprise at least one annular track. There may be at least two annular tracks, at least three annular tracks, at least four annular tracks, at least five annular tracks, at least six annular tracks, at least seven annular track, at least eight annular tracks, at least nine annular tracks or at least ten annular tracks. There may be no more than ten annular tracks. At least two pairs of annular tracks may be equally spaced apart radially. The circular array may comprise at least one radial track. There may be at least three radial tracks, at least four radial tracks, at least five radial tracks, at least six radial tracks, at least seven radial track, at least eight radial tracks, at least nine radial tracks or at least ten radial tracks. There may be no more than ten radial tracks. At least two pairs of radial tracks may be equally spaced apart angularly.

The mesh may comprise a first elongate line and a plurality of second shorter lines spaced along and crossing the first line along its length. The second shorter lines may not cross any other lines.

The mesh may comprise a line and the conductive element may comprise a plurality of pads spaced along the line.

The pads may be opaque. The mesh may be opaque. The pad and mesh may be disposed on a substrate which is opaque. The pad and mesh may be disposed on a substrate comprising paper, card and/or plastic.

The present invention seeks to provide an improved conductive element for use as a connector.

According to a third aspect of the present invention there is provided a conductive element comprising a set of elongate conductive tracks and a set of conductive members crossing said tracks.

This can reduce the capacitance of the conductive element without significantly reducing conductivity of the conductive element and so provide a connector which has a lower capacitance.

The connector may be linked to a capacitive sensing element having a capacitance $C_p$. The capacitive sensing element may take the form of a pad of conductive material (e.g. carbon-based or metal-based conductive ink, or foil) or a composite conductive element formed of a pad of relatively low conductivity material and a mesh of relatively high conductivity material. The connector has a capacitance, $C_c$. The connector preferably has a capacitance which is significantly lower than the capacitive sensing element, for example $C_c<0.2\times C_p$ or $C_c<0.1\times C_p$. Thus, the connector does not itself act as a capacitive sensing element and helps to avoid unintended actuation.

The tracks and/or members may have a sheet resistance (when tested as a solid pad) of no more than 50 $\Omega$sq$^{-1}$, no more than 20 $\Omega$sq$^{-1}$ or no more than 10 $\Omega$sq$^{-1}$. The conductive mesh may have a sheet resistance of no more than 5 $\Omega$sq$^{-1}$, no more than 2 $\Omega$sq$^{-1}$ or no more than 1 $\Omega$sq$^{-1}$. The conductive mesh may have a sheet resistance of at least 0.1 $\Omega$sq$^{-1}$, at least 0.2 $\Omega$sq$^{-1}$, at least 0.5 $\Omega$sq$^{-1}$ or at least 1 $\Omega$sq$^{-1}$.

The tracks and/or members may comprise a conductive ink. The tracks and/or members may comprise a metal-based conductive ink. The tracks and/or members may comprise a silver-based conductive ink. The tracks and/or members may comprise a conductive foil.

The tracks and/or members may have a thickness of at least 1 μm, at least 2 μm, at least 5 μm or at least 10 μm. The tracks and/or members may have a thickness of no more than 5 μm or no more than 10 μm. The tracks and/or members may have a thickness in a range of about 1 μm to about 5 μm.

The tracks may have a width of at least 100 μm, at least 200 μm or at least 500 μm. The tracks may have a width of at least 1 mm, at least 2 mm or at least 5 mm. The tracks may be spaced apart by at least 100 μm, at least 200 μm or at least 500 μm. The tracks may be spaced apart at least 1 mm, at least 2 mm, or at least 5 mm. The tracks may be are spaced apart at least 10 mm or at least 20 mm.

The set of elongate conductive tracks may run generally in a first direction and the tracks may be spaced apart in second, transverse direction.

The set of tracks may comprise one track. The set of tracks may comprise at least two tracks. The set of tracks comprise no more than 10 tracks.

The track may have a length of at least 100 mm, at least 200 mm of at least 500 mm.

The set of tracks may be parallel.

The members may have a width of at least 100 μm, at least 200 μm or at least 500 μm. The members may have a width of at least 1 mm, at least 2 mm or at least 5 mm. The members may be spaced apart by at least 100 μm, at least 200 μm or at least 500 μm. The members may be spaced apart at least 1 mm, at least 2 mm, or at least 5 mm. The members may be spaced apart at least 10 mm or at least 20 mm. The members may cross the tracks perpendicularly.

Some or all of the members may each link some or all of the tracks. For example, a member may cross between outermost tracks of the set of tracks and link the outermost tracks and any tracks between the outermost tracks.

According to a fifth aspect of the present invention there is provided an article comprising a substrate and at least one or at least two conductive elements according to any preceding claim supported on the substrate.

The substrate may comprise paper, card or other fibre-based material, or a plastic. The substrate may be a laminate.

According to a sixth aspect of the present invention there is provided a device comprising a microcontroller and at least one conductive element operationally connected to the microcontroller.

The at least one conductive element may be for connecting capacitive sensing conductive element(s) and the microcontroller. Alternatively, the at least one conductive element may be for capacitive sensing and the device may further comprise at least one conductive element for connecting the capacitive sensing conductive element(s) and the microcontroller.

According to a seventh aspect of the present invention there is provided a method comprising printing a conductive pad comprising relatively low conductivity material and having a reversed out image of a conductive mesh and printing a conductive mesh comprising relatively high conductivity material aligned with the reversed out image over or under the conductive pad.

According to an eighth aspect of the present invention there is provided a capacitive sensing element comprising a pad of relatively low conductivity conductive ink and a mesh of relatively high conductivity material underlying, overlying the pad and/or in plane with the pad, the mesh and pad being directly in contact so as to form a single, composite conductive element, wherein the composite conductive element is supported on a substrate. The capacitive sensing element may provide a single key capacitive touch or proximity switch.

The mesh may comprise relatively high-conductivity conductive ink or foil. The composite conductive element and/or the substrate may be opaque. The substrate may be flexible and may be paper, card and/or plastic.

According to a ninth aspect of the present invention there is provided a conductive element comprising a set of elongate conductive tracks and a set of conductive members crossing said tracks without any conductive layer overlying or underlying and in direct contact with the conductive element.

The element may comprise relatively high-conductivity conductive ink or foil.

According to a tenth aspect of the present invention there is provided a printed article comprising a substrate of paper, card and/or plastic and a plurality of capacitive sensing elements and/or connectors supported on the substrate.

The substrate may have a thickness in a range 25 μm to 250 μm, for example, about 120 to 130 μm. The substrate may have a thickness of greater than 250 μm. The substrate may have a thickness of up to 1 mm, up to 5 mm or up to 10 mm.

The substrate may have a relative permittivity, $\in_r$, of between about 2 to 4. For example, paper may have a relative permittivity between about 3.5 and 4.0.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
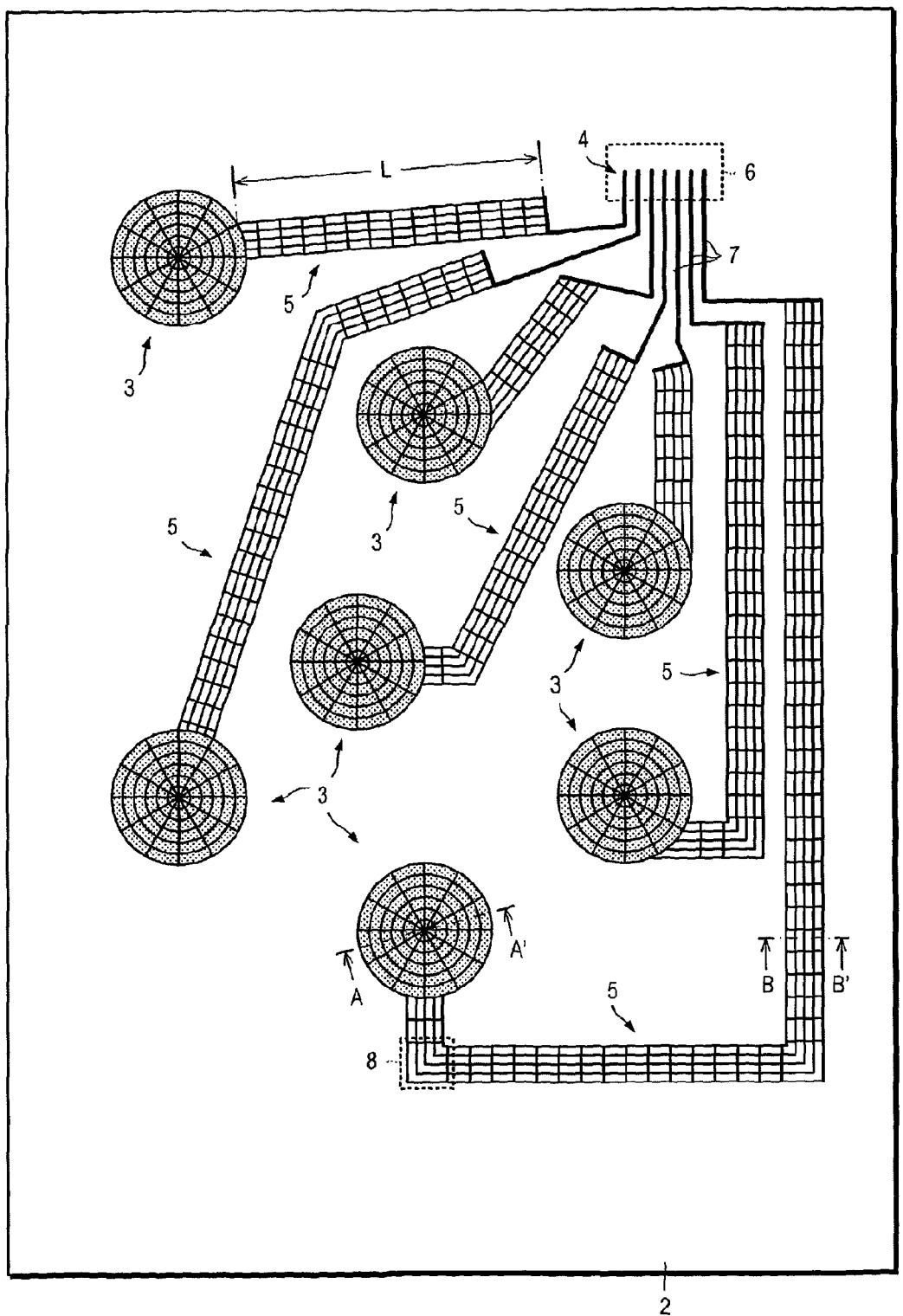
FIG. 1 is a plan view of a user interface sheet supporting a plurality of conductive elements in accordance with the present invention.

Referring to FIG. 1, a user interface sheet 1 for capacitive sensing in accordance with the present invention is shown.

The sheet 1 comprises a substrate 2 which supports a plurality of conductive elements 3 of a first type distributed across the substrate 2, a set of terminals 4 and a plurality of conductive elements 5 of a second type. As shown in FIG. 1, the terminals 4 are grouped in an area 6 to which a device or connector can be attached and make contact with the terminals 4.

The first type of conductive elements 3 are for capacitive sensing and are hereinafter referred to as "capacitive sensing elements" or "capacitive sensors". The second type of conductive elements 5 are for connecting the capacitive sensing elements 3 to single tracks 7 which in turn are connected to the terminals 4. The second type of conductive elements 5 are hereinafter referred to as "connecting elements" or "connectors". The connecting elements 5 may include one or more turns 8. In some examples, two or more capacitive sensing elements 3 may be connected by one or more connecting elements 5, i.e. forming a series of linked capacitive sensing elements 3. Each capacitive sensing element 3 serves as a single key capacitive touch or proximity switch.

The substrate 2 comprises an electrically insulating material and is flexible. In this example, the substrate 2 comprises a sheet of thick paper or card having a weight, for example, of about 100 to about 200 g/m². The substrate 2 may have a weight of up to 350 g/m² or more. However, plastics materials, such as polyethylene terephthalate (PET), can be used. In some embodiments, the substrate 2 may be rigid or stiff. For example, the substrate 2 may comprise paperboard, cardboard, hardboard or thick plastic. The substrate 2 and/or the conductive elements 3, 5 may be opaque, i.e. non-transparent. The substrate 2 may support printed indicia (not shown), such as text and/or graphics. The printed indicia (not shown) may cover the conductive elements 3, 5. A protective layer (not shown) may cover the conductive elements 3, 5. The protective layer (not shown) may be transparent or opaque and may support printed indicia (not shown), such as text and/or graphics. The protective layer (not shown) may comprise paper or card or plastic. The protective layer (not shown) may be glued to the sheet 2 or be laminated. The substrate material has a relative dielectric constant, $\in_r$. The relative dielectric constant may be between about 2 and 4 or more.

In this example, the sheet 1 has dimensions of 297×420 mm, i.e. A3 as defined by International Standards Organization (ISO) 216. However, the sheet 1 can be larger, for example A0, A1 or A2, or smaller, for instance, A4 or A5.

Figure 1A:
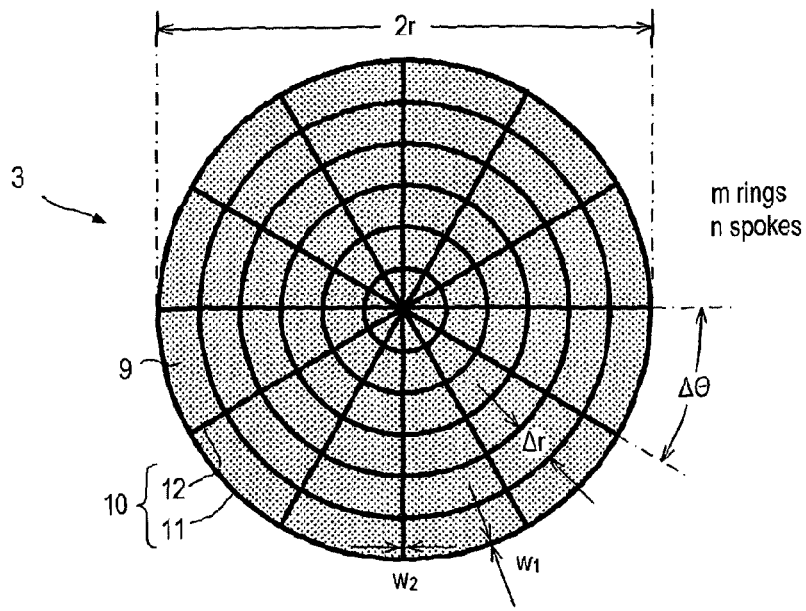
FIG. 1a is magnified view of a first type of conductive element.

As shown in FIGS. 1 and 1a, the capacitive sensing elements 3 take the form of circular conductive pads, i.e. conductive discs. The capacitive sensing elements 3 each have a radius, r, of about 30 mm. The capacitive sensing elements 3 can be larger or smaller. Furthermore, all of the capacitive sensing elements 3 need not be the same size.

Figure 2:
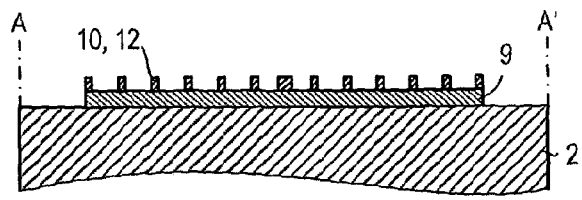
FIG. 2 is a cross section of the first type of conductive element taken along the line A-A' in FIG. 1.

Referring also to FIG. 2, each capacitive sensing element 3 comprises a pad 9 comprising relatively low conductivity material, in this case carbon-based conductive ink, and a conductive skeleton or mesh 10 comprising relatively high conductivity material, in this case silver-based conductive ink, overlying the pad 9 so as to form a composite structure. The sheet resistance of the pad 9 may be at least 1 k$\Omega$sq$^{-1}$ and may typically lie in a range of 10 to 50 k$\Omega$sq$^{-1}$. The sheet resistance of (a solid block of) the mesh 10 may be no more than 10 $\Omega$sq$^{-1}$ and may typically lie in a range of 1 to 5 $\Omega$sq$^{-1}$. In this example, the pad 9 and mesh 10 have approximately the same thickness lying in a range of about 0.5 to 10 µm, typically in a range of about 1 to 5 µm. In this example, no further overlying or underlying layers of conductive material are included in the composite structure.

The pad 9 comprises a single solid block of conductive material. However, the pad 9 can include voids or slots, and/or be broken up into discrete blocks of material.

The conductive mesh 10 comprises a circular array of m concentric rings 11 and n spokes 12 and has a dart board-like appearance in plan view. In this example, there are six rings 11 (m=6) and twelve spokes 12 (n=12). The rings 11 are radially equally spaced from neighbouring rings 11 by a distance, $\Delta r$, and the spokes 12 are angularly equally spaced from neighbouring spokes by an angle, $\Delta\theta$. In this example, $\Delta r$=5 mm and $\Delta\theta$=30°.

The rings 11 have a first line width, $w_1$, and the spokes 12 have a second line width, $w_2$. In this embodiment, the rings 11 and spokes 12 has the same line width, i.e. $w_1$=$w_2$, and have a thickness of about 300 µm. However, the rings 11 and spokes 12 may have different line widths from each other and/or may be thicker or thinner, e.g. about 500 µm.

The capacitive sensing elements 3 need not be circular and the conductive mesh 10 can have other, non-circular shapes. For example, a capacitive sensing element 3 can be oval, rectangular (for example square) or polygonal, or be a non-regular or non-uniform shape. The conductive mesh 10 need not be a circular array, but can be a rectangular array or take any shape, which may be non-regular or non-uniform and/or which may include non periodic features or members. The members 11, 12 of the mesh 10 need not cross at right angles. Furthermore, the members 11, 12 of the mesh need not define identically shaped and/or identically sized open regions. In some examples, the mesh 10 may comprise only one node, for example a set of spokes 12 joined in the middle.

The mesh 10 may take the form of a fibrous line which comprises an elongate line with shorter lines crossing the line along its length. Thus, the elongate line can provide a highly conductive backbone or trunk and the shorter lines can provide highly conductive branches. Multiple fibrous lines can be connected to form a fibrous mesh or network. A mesh comprising, for example, an array of lines, may additionally be provided with shorter lines to form, for example, a fibrous array.

The conductive mesh 10 need not comprise conductive ink. For example, in some embodiments, the conductive mesh 10 may comprise a metal foil, for example formed by hot or cold foil stamping.

The conductive mesh 10 need not overlie the conductive pad 9. For example, the conductive mesh 10 can lie under the conductive pad 9. In certain embodiments, two or more conductive pads 9 and/or conductive meshes 10 can be provided in a stacked structure or sandwich arrangement. In some embodiments, the conductive pad 9 may take the form of discrete blocks of conductive material with open regions of the mesh 10 filled with the discrete blocks of the conductive material, i.e. most of the pad 9 and most of the mesh 10 are co-planar. As will be explained in more detail hereinafter, this arrangement can be achieved using a so-called "reversing out" process.

By employing the conductive mesh 10 using the relatively high conductivity material, the capacitive sensing element 3 has a lower sheet resistance than a capacitive sensing element which only uses the relatively low conductivity material.

Figure 1B:
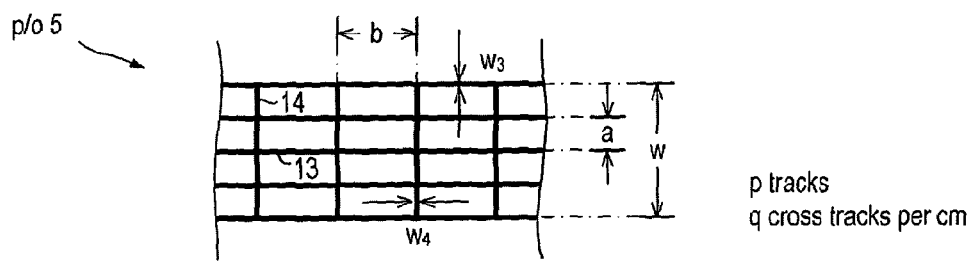
FIG. 1b is a magnified view of a section of a second type of conductive element.
Figure 3:
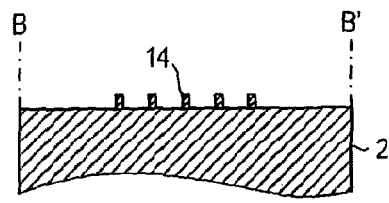
FIG. 3 is a cross section of the second type of conductive element taken along the line B-B' in FIG. 1.

Referring to FIGS. 1, 1b and 3, each connecting element 5 comprises a set of elongate conductive tracks 13 and a set of conductive members 14 crossing the tracks (hereinafter referred to as "crossing members" or "linking members"). In this example, the connecting element 5 comprises silver-based conductive ink, that is, the same material used to form the conductive meshes 10 (FIG. 1a). As shown in FIG. 1, a connecting element 5 can have a length, L, of between about 10 mm and about 500 mm. However, the length of a connecting element 5 can exceed 500 mm.

The elongate conductive tracks 13 form a band having a width, w. In this and other embodiments, the band is generally wider than the width of a finger, which is typically about 20 mm. In this embodiment, w=25 mm.

The connecting element 5 comprises p tracks 13 and q crossing members 14 per centimeter. In this example, there are five tracks 13 (p=5) and one crossing member 14 per unit centimeter (q=1 cm$^{-1}$). The tracks 13 run parallel to each other and are equally spaced by a distance, a. In this example, a=5 mm. The crossing members 14 are parallel to each other and are equally spaced by a distance, b. In this example, b=10 mm. As shown in FIGS. 1 and 1b, the cross-linking members 14 run across the tracks 13 perpendicularly. Also, as shown in FIGS. 1 and 1b, the crossing members 14 extend between outer tracks of the connecting element 5 linking the tracks. However, a crossing member 14 need not cross all the tracks 13.

The tracks 13 have a third line width, $w_3$, and the crossing members 14 have a fourth line width, $w_4$. In this embodiment, the tracks 13 and crossing members 14 have the same line width, i.e. $w_3$=$w_4$, and have a thickness of about 300 µm. However, the tracks 13 and crossing members 14 may have different line widths from each other and may be thicker or thinner, e.g. about 500 µm.

The connecting element 5 can be thought of as a single track which has been divided into separate narrow tracks which have been spaced apart. If the user places their finger over the connecting element 5, then there is less capacitive coupling. If the width of the conducting element 5 is greater than the width of a finger, then capacitive coupling will greatly reduced. Each connecting element 5 preferably has a capacitance $C_c$ (between a conductive element 3 and a terminal 4) such that $C_c \leq 0.2 \times C_p$ or $C_c \leq 0.1 \times C_p$, where $C_p$ is the capacitance of the conducting element 5. Each connecting element 5 preferably has a resistance $R_c$ (between a conductive element 3 and terminal 4) such that $R_c \leq 10$ k$\Omega$ or $R_c \leq 5$ k$\Omega$. Thus, the connecting elements 5 do not impede charging and discharging of the conductive elements 3. The use of the crossing members 14 can help to link tracks 13 and so minimise the effect of defects and/or breaks.

Figure 4:
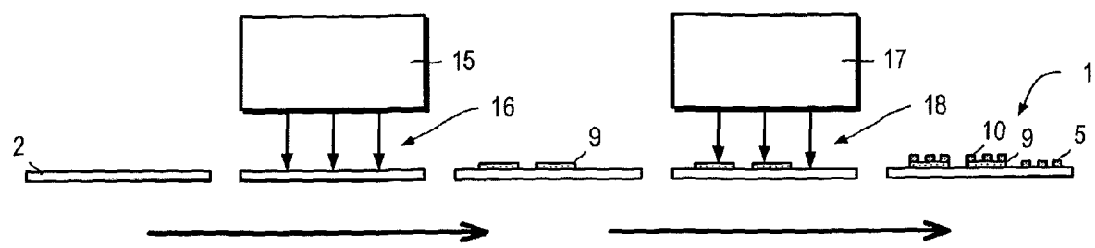
FIG. 4 illustrates a method of manufacturing the user interface sheet shown in FIG. 1.

Referring to FIG. 4, a method of manufacturing the sheet 1 will now be described.

The conductive elements 3, terminals 4 and tracks 5 can be formed using a printing process, such as screen printing, ink jet printing, flexography or offset printing.

As shown in FIG. 4, a first printer 15, e.g. an inkjet, offset or screen printer, is used to apply a first ink 16 on to the substrate 2. In this example, the first ink 16 comprises a carbon-based conductive ink and is used to form conductive pads 9.

The ink 16 is left sufficiently long to dry or is cured to allow a further layer of ink to be printed.

A second printer 17, e.g. an inkjet, offset or screen printer, is used to apply a second ink 18 on to the sheet 2. The second ink 18 comprises a silver-based conductive ink is used to form the terminals 4 (FIG. 1), the connecting element 5 and the conductive mesh 10.

Suitable conductive inks are available from Sun Chemical Corporation, Parsippany, N.J., USA.

As explained earlier, the order in which the inks 16, 18 can be reversed. Also, the relatively high conductivity ink can be replaced by a metal foil, for example, comprising aluminium or silver.

Figure 5:
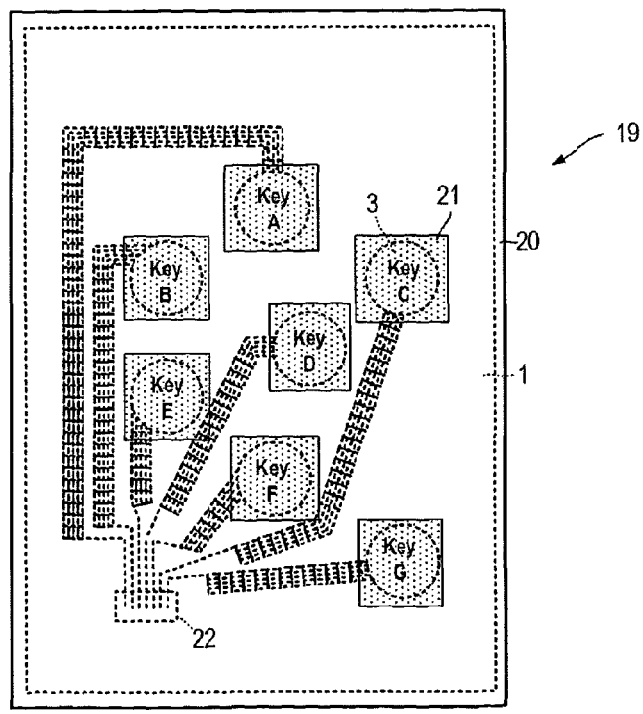
FIG. 5 illustrates an interactive printed article including the user interface sheet shown in FIG. 1.

Referring to FIG. 5, an interactive printed article 19 employing the sheet 1 is shown.

The interactive printed article 19 takes the form of an interactive poster. A sheet 1 is placed behind a poster 20 having indicia 21 printed thereon and so provide a user interface. A single sheet may be used, in other words, one side of the sheet supports the user interface and the reverse supports printed indicia. The capacitive sensing elements 3 can be aligned with some of the indicia 21 in places which guide, invite or instruct a user to touch the poster in those places. A device 22 is mounted to the sheet 1 which alone or in conjunction with other circuitry can provide audio and/or visual output.

Referring again to FIG. 1a, if a printing line is used to form the capacitive sensing element 3, then it may be printed "wet-on-wet", i.e. the conductive mesh 10 is printed on the conductive pad 9 while the ink forming the conductive pad 9 is still wet. However, this may result in intermixing of the inks, which can reduce the conductivity of the conductive mesh 10.

One solution is to wait sufficiently long, for example a few hours, between printing the conductive pad 9 and printing the conductive mesh 10 for the ink of the conductive pad 9 to dry.

Another, quicker solution is to use ink formulations which are curable using, for example, ultraviolet (UV) light and to cure the ink of the conductive pad 9 before printing the conductive mesh 10.

A further solution is to employ a process of "reversing out", as will now be described in more detail.

Figure 6:
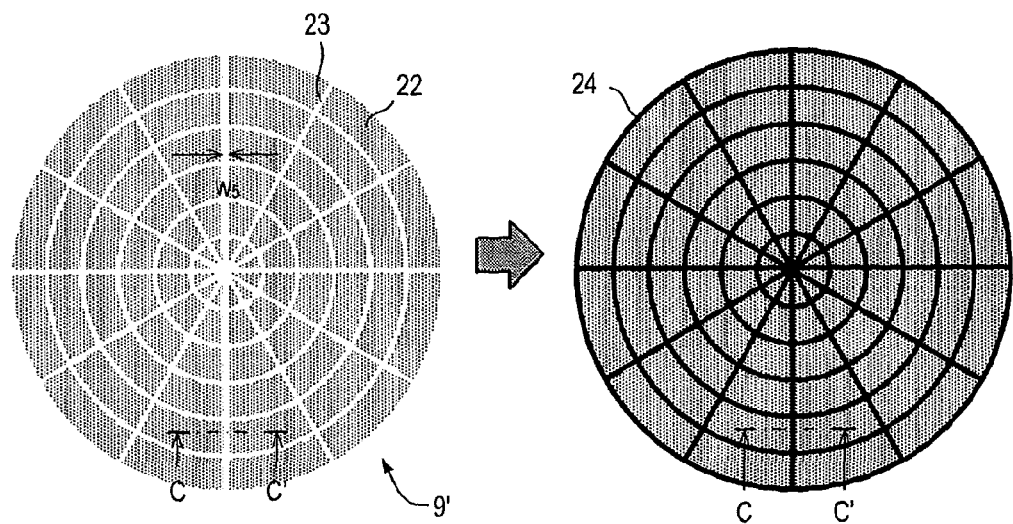
FIG. 6 illustrates, in a plan view, printing a conductive pad with a pattern of a mesh reversed out and printing an overlapping mesh.
Figure 7:
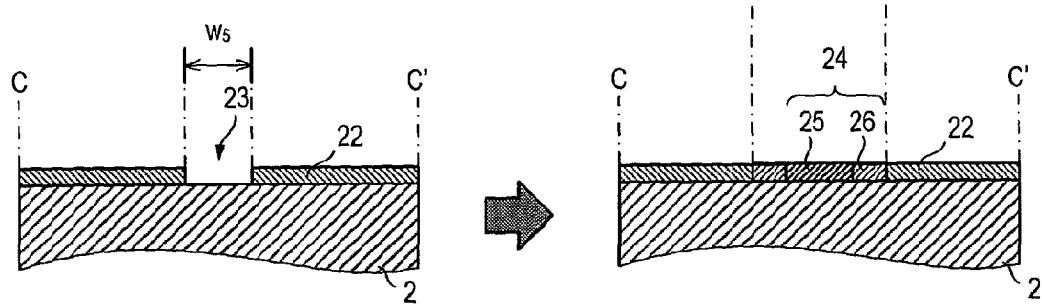
FIG. 7 is a cross section taken along the line C-C' in FIG. 6.

Referring to FIGS. 6 and 7, a modified form of conductive pad 9' can be printed. The conductive pad 9' is made up of regions 22 of ink with a reversed-out image 23 of, in this example, the conductive mesh 10. The gaps making up the image 23 have a width, w5, for example of about 0.5 mm. A conductive mesh, which can be the same as the conductive mesh 10 (FIG. 1a) described earlier, is then printed on top having a line width, $w_6$, where $w_6 > w_5$, for example, 1 mm. This forms an intermixed mesh 24 comprising a first, central region 25 comprising material which has a high conductivity and a second, interface region 26 which comprises a mixture of the inks which has a lower conductivity than the ink in the first region 25. It will be appreciated that the pattern of the pad and mesh can differ, as hereinbefore described. It will also be appreciated that the order of printing may be reversed, i.e. the conductive mesh is printed first and then the conductive pad 9' is printed.

Thus, even if "wet-on-wet" printing is used, a highly conductive mesh or skeleton can still be formed.

It will be appreciated that many modifications may be made to the embodiments hereinbefore described. The interactive printed article need not be a poster, but can be a book, calendar, greeting card, product packaging or point of sale display. The substrate can be any form of fibre-based material, such as paper or card.

A sheet 1 which supports capacitive sensing elements 3 and connecting elements 5 may be applied to another article. For example, the sheet 1 may line an injection moulding die (not shown) and material such as plastic (not shown) may be injected into the die to form an article (not shown) which includes the sheet 1, for example covering it surface. Therefore, capacitive sensing elements 3 can be easily incorporated into an article which, for example, has a complex shape.

The invention claimed is:

1. A printed article comprising:
   a substrate; and
   at least one capacitive touch switch supported on the substrate;
   wherein each capacitive touch switch comprises:
   a conductive pad comprising relatively low conductivity material; and
   a conductive mesh comprising relatively high conductivity material underlying or overlying the pad and being in contact with the pad so as to form a composite conductive element,
   wherein the conductive mesh includes open areas without the relatively high conductivity material, each open area being a least 20 mm$^2$.

2. A printed article according to claim 1, wherein the conductive pad has a sheet resistance of at least 1 k$\Omega$sq$^{-1}$, at least 2 k$\Omega$sq$^{-1}$ or at least 5 k$\Omega$sq$^{-1}$.

3. A printed article according to claim 1, wherein the conductive pad has a sheet resistance of at least at least 10 k$\Omega$sq$^{-1}$, at least 20 k$\Omega$sq$^{-1}$ or at least 50 k$\Omega$sq$^{-1}$.

4. A printed article according to claim 1, wherein the conductive mesh has a sheet resistance of no more than 50 $\Omega$sq$^{-1}$, no more than 20 $\Omega$sq$^{-1}$ or no more than 10 $\Omega$sq$^{-1}$.

5. A printed article according to claim 1, wherein the conductive mesh has a sheet resistance of no more than 5 $\Omega$sq$^{-1}$, no more than 2 $\Omega$sq$^{-1}$ or no more than 1 $\Omega$sq$^{-1}$.

6. A printed article according to claim 1, wherein the conductive pad comprises conductive ink.

7. A printed article according to claim 1, wherein the conductive pad comprises a carbon-based conductive ink.

8. A printed article according to claim 1, wherein the conductive mesh comprises a conductive ink.

9. A printed article according to claim 1, wherein the conductive mesh comprises a metal-based conductive ink.

10. A printed article according to claim 9, wherein the conductive mesh comprises a silver-based conductive ink.

11. A printed article according to claim 1, wherein the conductive mesh comprises a conductive foil.

12. A printed article according to claim 1, wherein the capacitive touch switch has a surface area of at least 100 mm$^2$, at least 200 mm$^2$ or at least 500 mm$^2$.

13. A printed article according to claim 1, wherein the capacitive touch switch has a surface area of at least 1,000 mm$^2$, at least 2,000 mm$^2$ or at least 5,000 mm$^2$.

14. A printed article according to claim 1, wherein the capacitive touch switch has a surface area of no more than 5,000 mm$^2$, no more than 10,000 mm$^2$ or no more than 20,000 mm$^2$.

15. A printed article according to claim 1, wherein the conductive pad comprises a layer which is a solid block.

16. A printed article according to claim 1, wherein the conductive pad has a thickness of at least 1 μm, at least 2 μm, at least 5 μm or at least 10 μm.

17. A printed article according to claim 1, wherein the conductive pad has a thickness no more than 5 µm or no more than 10 µm.

18. A printed article according to claim 1, wherein the conductive mesh has a thickness of at least 1 µm, at least 2 µm, at least 5 µm or at least 10 µm.

19. A printed article according to claim 1, wherein the conductive mesh has a thickness of no more than 5 µm or no more than 10 µm.

20. A printed article according to claim 1, wherein the conductive mesh comprises tracks having a width of at least 100 µm, at least 200 µm or at least 500 µm.

21. A printed article according to claim 1, wherein the conductive mesh comprises tracks having a width no more than 1 mm, no more than 2 mm or no more than 5 mm.

22. A printed article according to claim 1, wherein the conductive mesh comprises tracks having a width of at least 1 mm, at least 2 mm or at least 5 mm.

23. A printed article according to claim 1, wherein the mesh comprises an array of tracks.

24. A printed article according to claim 1, wherein the mesh comprises a circular array of tracks.

25. A printed article according to claim 24, wherein the circular array comprises at least one annular track.

26. A printed article according to claim 25, wherein there are at least three annular tracks, at least four annular tracks, at least five annular tracks, at least six annular tracks, at least seven annular track, at least eight annular tracks, at least nine annular tracks or at least ten annular tracks.

27. A printed article according to claim 25, wherein the circular array comprises at least one radial track.

28. A printed article according to claim 27, wherein at least two pairs of radial tracks are equally spaced apart angularly.

29. A printed article according to claim 1, wherein the substrate comprises paper.

30. A printed article according to claim 1, wherein the substrate comprises card.

31. A printed article according to claim 1, wherein the substrate comprises a polymer.

32. A printed article according to claim 1, further comprising:
   a microcontroller; and
   a set of at least one conductive elements operationally connected to the microcontroller.

* * * * *